(12) United States Patent
Ho et al.

(10) Patent No.: US 7,499,335 B2
(45) Date of Patent: Mar. 3, 2009

(54) NON-VOLATILE MEMORY WITH IMPROVED ERASING OPERATION

(75) Inventors: Wen-Chiao Ho, Tainan (TW);
Chin-Hung Chang, Tainan (TW);
Kuen-Long Chang, Taipei (TW);
Chun-Hsiung Hung, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 66 days.

(21) Appl. No.: 11/703,916

(22) Filed: Feb. 7, 2007

(65) Prior Publication Data
US 2008/0186780 A1 Aug. 7, 2008

(51) Int. Cl.
*G11C 16/04* (2006.01)
(52) U.S. Cl. .............................. 365/185.28; 365/185.3; 365/185.22
(58) Field of Classification Search ............ 365/185.29, 365/185.3, 185.22
See application file for complete search history.

(56) References Cited

U.S. PATENT DOCUMENTS 7,230,853 B2 * 6/2007 Kwon et al. ........... 365/185.22

* cited by examiner

*Primary Examiner*—Huan Hoang
(74) *Attorney, Agent, or Firm*—Jianq Chyun IP Office

(57) ABSTRACT

A method for performing an erase operation is disclosed in a non-volatile memory having a plurality of memory cells. At least one memory cell is programmed having a threshold voltage level in a first region before programming, and after programming the memory cell has a threshold voltage level in a second region, wherein the second region is higher in threshold voltage than the fist region. The erasing operation implements a programming of memory bits that can inject negative charge carriers or electrons into a memory cell instead of using the conventional technique of injecting hot holes into the memory cell. This can avoid room temperature drift and charge loss caused by hot hole injection.

11 Claims, 4 Drawing Sheets

NON-VOLATILE MEMORY WITH IMPROVED ERASING OPERATION

FIELD OF THE INVENTION

The present invention relates generally to non-volatile memory devices and, more particularly, to a non-volatile memory with improved erasing operation.

BACKGROUND OF THE INVENTION

Today, electronic devices commonly use non-volatile memory storage devices to store massive amounts of data. For example, cell phones have the capability of obtaining and storing images that can be transferred to other devices. Such information can be stored in one or more non-volatile memory devices. To process and store such information, these types of storage devices constantly require programming and erasing of memory bits in memory cell arrays. A common non-volatile memory is a charge trapping memory, which is capable of storing two bits in a memory cell.

FIG. 1 illustrates a simple cross-section of a memory cell 100 for a prior charge trapping memory device. The charge trapping memory cell 100 includes a thin oxide-nitride-oxide (ONO) layer 110 over a source 120, a drain 130, and a channel 140 layer. A gate layer 150 is formed over the ONO layer 110. This cell can form a metal oxide silicon field effect transistor (MOSFET). Accordingly, for memory cell 100, data can be stored in the form of charge trapped in the ONO layer 110 over edges of the channel layer 140 that form part of a MOSFET. Programming of the charge trapping memory cell 100 can be performed by injecting channel hot electrons (CHE) into the ONO layer 110. Erasing can be performed by band-to-band-generated tunnel-assisted hot hole injection (HHI) into the ONO layer 110. To read the data stored in memory cell 100, a charge stored in the ONO layer 110 can be read by sensing the current from the drain and source when their roles are reversed relative to a programming operation. Because charge can be stored in the ONO layer 110 at both junction edges of the channel layer 140, the memory cell 100 can store two bits of data.

The transistor associated with the memory cell 100 has a threshold voltage that allows charge carriers, such as holes or electrons, from the channel layer 140 to move into the ONO layer 110. During a program operation, when electrons are injected into the memory cell 100, the threshold voltage of the memory cell 100 rises. On the other hand, during an erase operation, when holes are injected, electrons or negative charge carriers are reduced and the threshold voltage of the memory cell 100 falls. FIG. 2 illustrates a schematic diagram of threshold voltage distribution of a bit for the prior charge trapping memory cell 100 with respect to a cycle including a program and erase operation. The horizontal axis represents threshold voltage $V_t$ distribution and the vertical axis represents cycles in logarithmic scale. Referring to FIG. 2, for the program phase, the memory device begins with a low $V_t$ distribution for memory cells that goes to a high $V_t$ distribution. Conversely, for the erase program phase, the memory device decreases the threshold voltage level for the memory cells, which goes from the high $V_t$ distribution back to the low $V_t$ distribution (due to decrease in electrons or negative charge carriers). EV refers to the voltage level for erase verifying of a bit of the charge trapping memory cell. PV refers to the voltage level program verifying of a bit of the charge trapping memory cell, and RD refers to the voltage level for reading of a bit of the charge trapping memory cell.

There are a number of drawbacks with the prior charge trapping memory device that performs the erase operation using the hot hole injection HHI technique. This technique is susceptible to hot-hole charge trapping in the ONO layer that induces room temperature (RT) drift and charge loss, all of which results in threshold voltage fluctuation. RT drift arises because of the sensitivity of memory cells to room temperature that causes the threshold voltage of two-bit charge trapping memory cells to drift during an erase. This drift can deteriorate the reliability of data stored in the memory cells. Charge loss or retention loss changes the threshold voltage over time for a bit of a memory cell. The threshold voltage $V_t$ of the cell can change due to redistribution of trapped charge in the ONO layer. This can lead to read error.

Thus, what is needed is an improved non-volatile memory device that overcomes the above drawbacks during an erase operation.

BRIEF SUMMARY OF THE INVENTION

According to one aspect of the invention, in a non-volatile memory having a plurality of memory cells, a method is disclosed for performing an erase operation. At least one memory cell selected in an erase phase is programmed having a threshold voltage level in a first region before programming, and after programming the memory cell has a threshold voltage level in a second region, wherein the second region is higher in threshold voltage than the fist region.

According to another aspect of the invention, a non-volatile memory is disclosed. The memory includes a plurality of memory cells, each memory cell configured to store at least one memory bit. The memory also includes means for programming at least one memory cell selected in an erase phase having a threshold voltage level in a first region before programming, and after programming the memory cell has a threshold voltage level in a second region, wherein the second region is higher in threshold voltage than the first region.

According to another aspect of the invention, in a non-volatile memory having a plurality of memory cells, a method for performing an erase operation is disclosed. N cycles are executed. Each cycle includes a program phase and an erase phase, and wherein N is an integer greater than 1. The executing of each Nth cycle comprises selecting a first set of memory cells for a program phase and selecting a second set of memory cells for an erase phase; the memory cells of the first and second sets initially having a threshold voltage at a first threshold voltage level; programming the memory cells of the first set such that their threshold voltage level increases to a second threshold level; and programming the memory cells of the second set such that their threshold voltage level increases to the second threshold level.

BRIEF DESCRIPTION OF THE DRAWINGS

The accompanying drawings, which are incorporated in and constitute part of this specification, illustrate examples, implementations, and embodiments of the invention, and together with the description, serve to explain the principles of the invention. In the drawings.

DETAILED DESCRIPTION

Reference will now be made in detail to the exemplary embodiments of the invention, examples of which are illustrated in the accompanying drawings. Wherever possible, the same reference numbers will be used throughout the drawings to refer to the same. The following techniques overcome disadvantages of prior non-volatile memory devices that address room temperature drift and charge loss by eliminating the need to use hot hole injection (HHI) for an erase operation.

According to one example, in a non-volatile memory having a plurality of memory cells, a method is described for performing an erase operation. At least one memory cell selected in an erase phase is programmed having a threshold voltage level in a first region before programming, and after programming the memory cell has a threshold voltage level in a second region, wherein the second region is higher in threshold voltage than the fist region. The erasing operation implements a programming of memory bits that can inject negative charge carriers or electrons into a memory cell instead of using the conventional technique of injecting hot holes into the memory cell. This can avoid room temperature drift and charge loss caused by hot hole injection.

Figure 1:
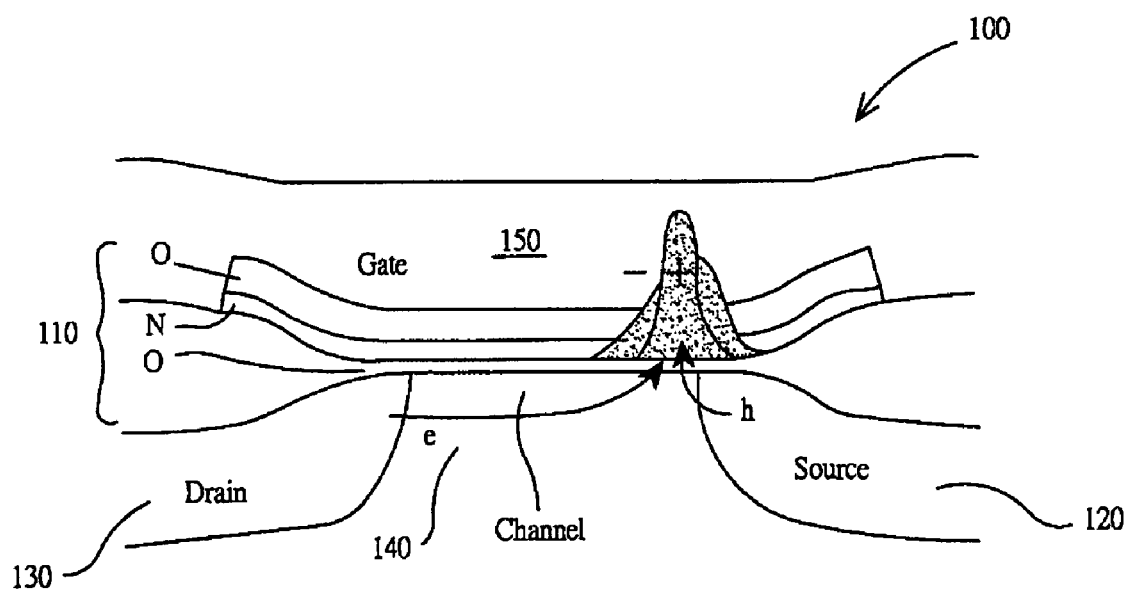
FIG. 1 illustrates a simple cross-section of a memory cell for a prior charge trapping memory device.
Figure 2:
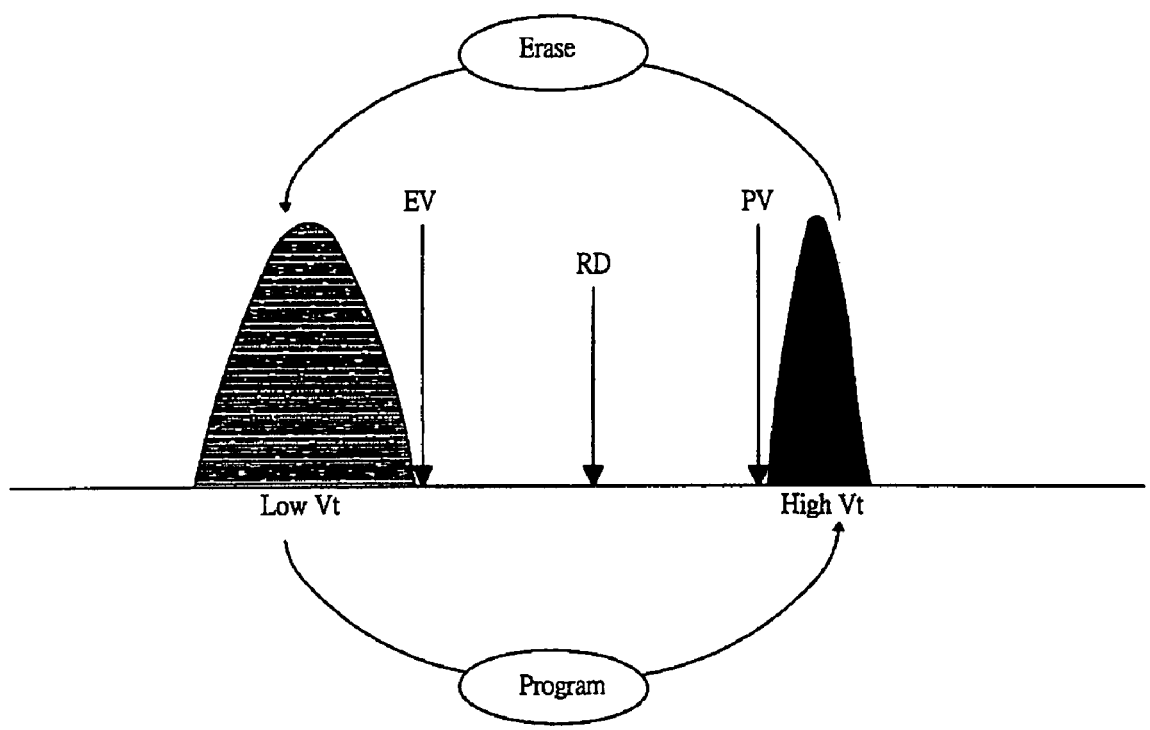
FIG. 2 illustrates a schematic diagram of threshold voltage distribution of a bit for the prior charge trapping memory cell with respect to a cycle including a program and erase operation.

The following techniques can be implemented for various non-volatile memory devices, such as silicon-oxygen-nitride-oxygen-silicon (SONOS) based memory devices, including a charge trapping memory device as shown in FIG. 1.

Figure 3:
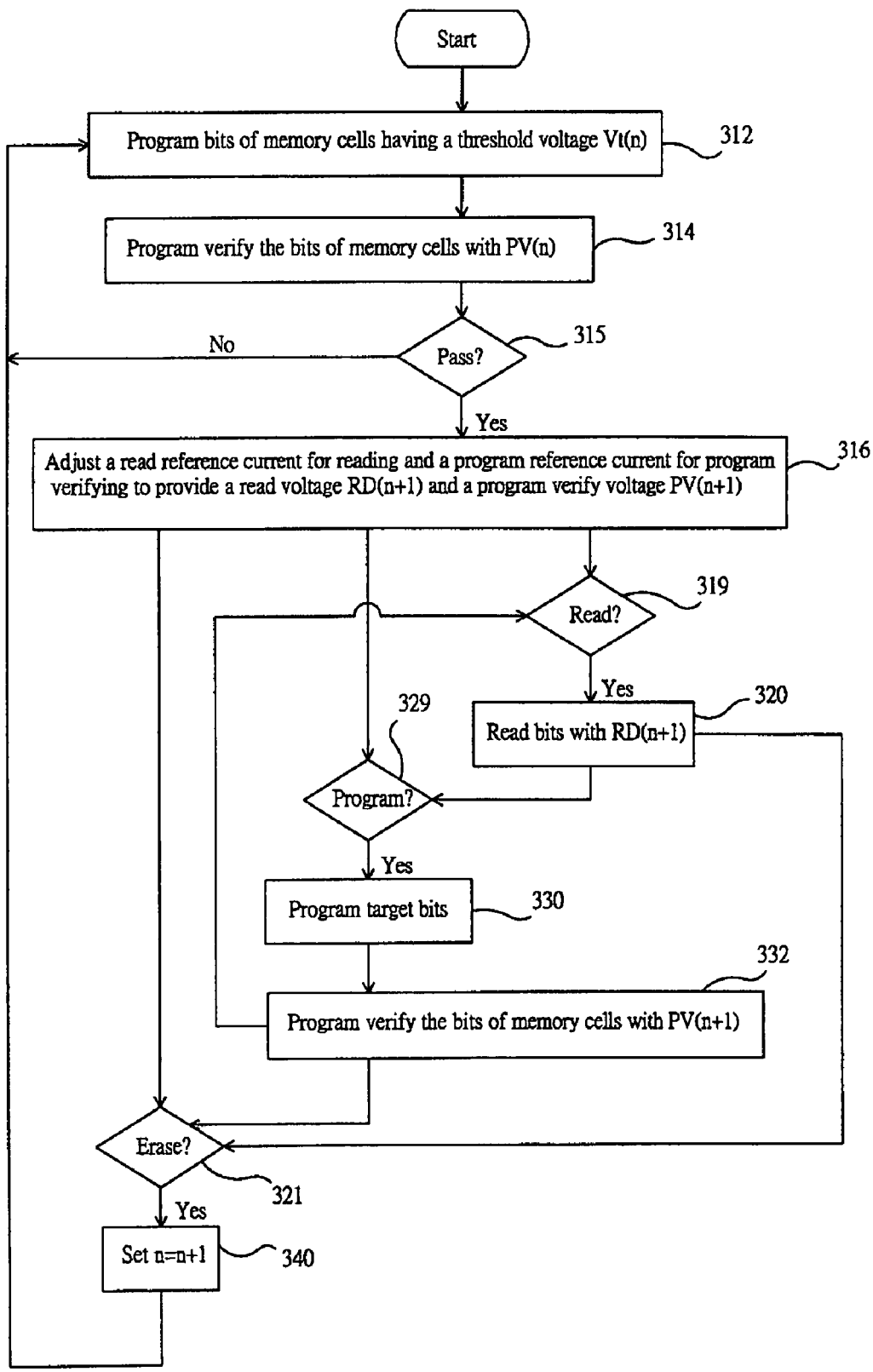
FIG. 3 illustrates one example of a flow diagram for a method of performing an erase operation in a non-volatile memory.

FIG. 3 illustrates one example of a flow diagram 300 for a method of performing an erase operation in a non-volatile memory. Although not shown (so as not to obscure the invention), the techniques can be implemented by circuitry in the memory configured or programmed to provide the means for implementing the erasing operation described herein. Initially, the memory is to perform an erase operation on one or more memory cells. In some examples, the erase operation occurs in a cycle after a program operation on a first set of memory cells.

At step 312, memory bits in a set of memory cells designated for erasing having a threshold voltage value lower than $Vt(n)$ are programmed so that their threshold voltage equals $Vt(n)$. The variable n can be an integer starting at 1 and $Vt(n)$ can represent a set of varying threshold voltages for different cycles of n. The first threshold value can indicate a threshold voltage representing memory cells with programmed bits. In this step, those memory bits of memory cells in the designated set not already programmed are then programmed to have a threshold voltage=$Vt(n)$ in cycle n. For a charge trapping or SONOS memory device, this can be implemented by injecting electrons into the ONO layer, e.g., by injecting channel hot electrons (CHE). In this way, all of the memory bits in the designated set of memory cells will have the same threshold voltage level $Vt(n)$. As such, using a hot hole injection (HHI) process that decreases the threshold voltage level of programmed memory cells is not necessary.

At step 314, the memory bits programmed in step 312 are program verified using a program verify voltage $PV(n)$. The variable n can be an integer starting at 1 and $PV(n)$ can represent a set of varying program verify voltages for different cycles of n. For example, for a first cycle, n can equal 1. At step 315, a determination is made if the memory bits passed the verification step 314. In one example, the threshold voltage of each of the programmed memory bits is compared with the $PV(n)$ voltage of the appropriate cycle. If the voltages are the same or substantially the same, it is determined the program verification for the memory bits passed. In that case the method proceeds to step 316. If not, the method returns back to step 312.

At step 316, a read reference current (for read verifying) and a program reference current (for program verifying) are adjusted to provide a new read voltage $RD(n+1)$ and a new program verify voltage $PV(n+1)$. In this step, the memory bits having increased threshold voltages based on the programming step are given the new read and program verify voltages. After step 316, the memory can perform a read operation at step 319, a program operation at step 329, and an erase operation at step 321.

At step 319, a read operation is initiated, and memory bits are then read with the new read voltage $RD(n+1)$ at step 320. Afterwards, the method can proceed to initiate an erase step 321 or a program step 329. At step 329, a program operation is initiated, and memory bits (target bits) are then programmed. At step 332, the programmed memory bits are then program verified with the new program voltage $PV(n+1)$ at step 330. Afterwards, the method can proceed to initiate an erase step 321. At step 321, an erase operation is initiated and the variable n is set or incremented to n=n+1 at step 340. The method then proceeds to step 312, which performs an erase function by injecting electrons as opposed to holes into selected memory cells. Thus, when n=2, at step 312 memory bits are programmed to have a new threshold voltage $Vt(2)$, which is higher than the threshold voltage $Vt(1)$.

For the above method, the traditional technique of injecting holes, i.e., the HHI technique, can be avoided. Furthermore, memory bits designated for an erase that have not been programmed within a cycle can be programmed to ensure that the threshold voltage levels of all designated memory bits are set relatively high. Therefore, the threshold voltage level for those memory bits, which at once low in a previous cycle, is higher in a subsequent cycle. This is further illustrated in FIG. 4, which shows a schematic diagram of the relationship of threshold voltages n cycles of the method of FIG. 3.

Figure 4:
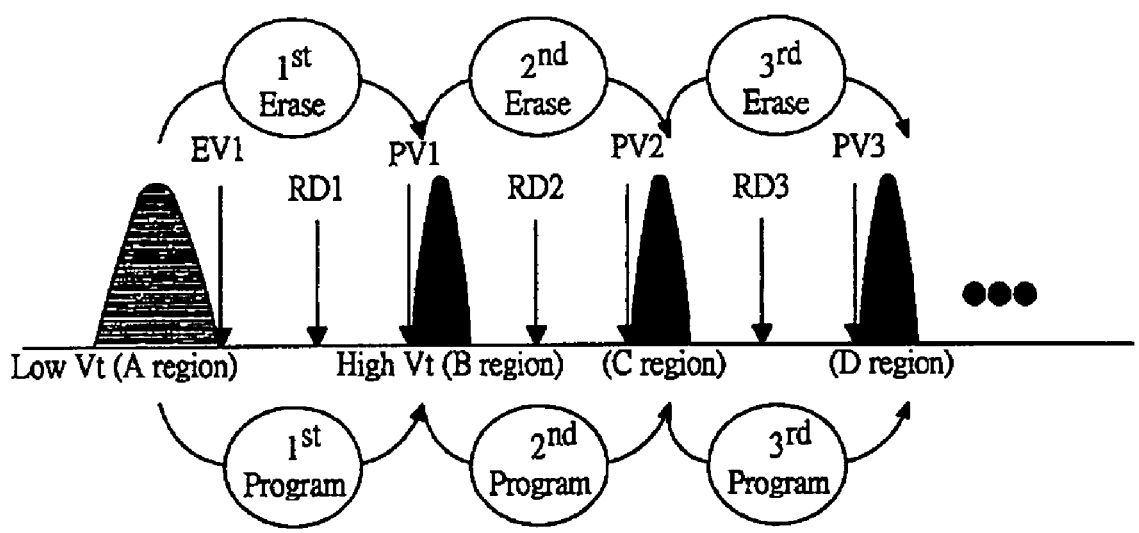
FIG. 4 illustrates one example of a schematic diagram showing the relationship of threshold voltages of memory bits during the n cycles of FIG. 3.

Referring to FIG. 4, the erasing technique programs memory bits that have not been programmed in a present cycle so that all bits of designated memory cells for an erase are at the higher threshold voltage level corresponding to the threshold voltage of programmed memory bits. This then becomes the threshold voltage for a subsequent cycle. For example, in a first program phase in a first cycle, selected memory bits in a set of memory cells having a low threshold voltage Vt in a region A can be programmed such that their threshold voltage levels increase to a high threshold voltage in Vt region B. Thus, some memory bits will have threshold voltage levels that remain in region A. In the first erase phase in the first cycle, a non-conventional erase operation is performed. That is, the memory bits still having threshold voltage levels in region A are programmed such that their threshold voltages increase to the programmed memory bits in region B. In this manner, all of the bits in the desired memory cells eventually have the same threshold voltage level in region B.

For the second cycle, in the second program phase of the second cycle, selected memory bits in a set of memory cells having a threshold voltage Vt in the region B can be programmed such that their threshold voltage levels increase to a higher threshold voltage level in a region C. Like the erase phase in the first cycle, in erase phase in the second cycle, memory bits that were not programmed still having a threshold voltage level in region B are programmed such that their threshold voltage levels increase to a region C. And for the third cycle, the same type of program and erase phases can be performed to move the threshold voltage levels from a region C to a region D. Each subsequent region for the next cycle, e.g., from regions A to D, having a higher threshold voltage level for programmed memory bits than the previous cycle.

Likewise, the read voltage and program verify voltage also increase with each subsequent cycles. For example, in the first cycle, the read voltage RD1 and program verify voltage PV1 increase in the second cycle to RD2 and PV2, respectively. This can continue for subsequent cycles. Hence, the data stored in the memory bits can be read correctly and the programming can be verified accurately in each cycle.

Thus, the techniques disclosed herein can improve the operation of a non-volatile memory device by not using HHI for an erase operation. In this way, the threshold voltages of memory bits in memory cells are at a relatively high level before a next cycle begins. Read voltage and program voltage levels can also increase for each subsequent cycle of a program and erase phase. This allows for the programming of the memory bits to be verified and the data stored in memory bits to be determined correctly. In some examples, adjusting the program verifying and reading voltage levels can be implemented by adjusting a read reference current and a program reference current in order to provide an updated read voltage and an updated program verify voltage for the next cycle.

The techniques disclosed herein can also be modified staying within the scope of the invention. For example, a read reference cell and a program reference cell can also be programmed to increase their threshold voltage levels. In particular, the read reference current and the program reference current can be decreased, while the read and program voltage levels can be increased accordingly. In another example, word line voltage levels of the read reference cell and program reference cell can be increased to increase the read voltage and the program verifying voltage levels for decreasing the read reference current and the program reference current, respectively.

Other examples of adjusting the reading and program verifying techniques include raising or increasing the word line voltage level of the memory cell array such that the current flowing on each memory cell is increased. Hence, the read reference current and the program reference current for reading and program verifying memory cells are relatively small then, and the data stored in memory bits can be read and verified correctly in accordance. That is, according to another example and referring to FIG. 3, the method can be changed to adjust the current flowing in each memory cell.

In the foregoing specification, the invention has been described with reference to specific examples and embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. In a non-volatile memory having a plurality of memory cells, a method for performing an erase operation comprising:
    increasing a threshold voltage level of at least one memory cell having a threshold voltage level in a first region corresponding to a previous erase state, such that the at least one memory cell has a threshold voltage level in a second region corresponding to a previous program state, wherein the second region is higher in threshold voltage than the first region.

2. The method of claim 1, further comprising programming at least one memory cell having a threshold voltage level in the second region before the programming, such that the memory cell has a threshold voltage level in a third region after the programming, wherein the third region is higher in threshold voltage than the second region.

3. The method of claim 2, further comprising:
    adjusting a first read voltage level for a memory cell having a threshold voltage in the first region before programming to a second read voltage level for the memory cell having a threshold voltage in the second region after programming.

4. The method of claim 2, further comprising:
    adjusting a first program verify voltage level for a memory cell having a threshold voltage in the first region before programming to a second program verify voltage level for the memory cell having a threshold voltage in the second region after programming.

5. The method of claim 1, wherein increasing the threshold voltage level of the at least one memory cell includes injecting electrons into the memory cell such that the threshold voltage level of the memory cell increases.

6. A non-volatile memory comprising:
    a plurality of memory cells, each memory cell configured to store at least one memory bit; and
    means for performing an erase operation by increasing a threshold voltage level of at least one memory cell having a threshold voltage level in a first region corresponding to a previous erase state, such that the at least one memory cell has a threshold voltage level in a second region corresponding to a previous program state, wherein the second region is higher in threshold voltage than the first region.

7. The non-volatile memory of claim 6, further comprising means for programming at least one memory cell having a threshold voltage level in the second region before the programming such that the memory cell has a threshold voltage level in a third region after the programming, wherein the third region is higher in threshold voltage than the second region.

8. The non-volatile memory of claim 7, further comprising means for adjusting a first read voltage level for a memory cell having a threshold voltage in the first region before programming to a second read voltage level for the memory cell having a threshold voltage in the second region after programming.

9. The non-volatile memory of claim 7, further comprising means for adjusting a first program verify voltage level for a memory cell having a threshold voltage in the first region before programming to a second program verify voltage level for the memory cell having a threshold voltage in the second region after programming.

10. The non-volatile memory of claim 6, wherein the means for performing an erase operation by increasing the threshold voltage level of the at least one memory cell includes means for injecting electrons into the memory cell such that the threshold voltage level of the memory cell increases.

11. In a non-volatile memory having a plurality of memory cells, a method for performing an erase operation comprising:
    executing N cycles, each cycle includes a program phase and an erase phase, and wherein N is an integer greater than 1, the executing of each Nth cycle comprising:
    selecting a first set of memory cells for the program phase and selecting a second set of memory cells for the erase phase; the memory cells of the first and second sets initially having a threshold voltage at a first threshold voltage level corresponding to a previous erase state;

programming the memory cells of the first set in the program phase such that their threshold voltage level increases to a second threshold voltage level; and increasing a threshold voltage level of the memory cells of the second set in the erase phase such that their threshold voltage level increases to the second threshold voltage level that corresponds to a previous program state, and adjusting a first read voltage level to a second read voltage level.

* * * * *